(12) United States Patent
Chandrasekaran

(10) Patent No.: US 8,283,776 B2
(45) Date of Patent: Oct. 9, 2012

(54) MICROFABRICATED PILLAR FINS FOR THERMAL MANAGEMENT

(75) Inventor: Arvind Chandrasekaran, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 179 days.

(21) Appl. No.: 12/693,760

(22) Filed: Jan. 26, 2010

(65) Prior Publication Data
US 2011/0180925 A1 Jul. 28, 2011

(51) Int. Cl.
*H01L 23/367* (2006.01)
*H01L 23/48* (2006.01)
*H01L 21/78* (2006.01)

(52) U.S. Cl. ......... 257/713; 257/E21.599; 257/E23.103; 257/E23.01; 257/712; 257/737; 257/738; 257/778; 257/717; 257/675; 257/720; 257/721

(58) Field of Classification Search ............... 257/713, 257/712, E21.599, E23.103, E23.01, 737, 257/738, 778, 717, 675, 720, 721, 734
See application file for complete search history.

(56) References Cited

U.S. PATENT DOCUMENTS

| | | | | |
|---|---|---|---|---|
| 6,455,924 B1* | 9/2002 | Alcoe et al. | ................ | 257/678 |
| 6,531,771 B1* | 3/2003 | Schoenstein et al. | ........ | 257/720 |
| 6,680,015 B2* | 1/2004 | McCullough | ................ | 264/105 |
| 6,870,246 B1* | 3/2005 | Mullen et al. | ................ | 257/678 |
| 7,196,904 B2* | 3/2007 | Ku | ................ | 361/703 |
| 7,271,034 B2* | 9/2007 | Brunschwiler et al. | ........ | 438/119 |
| 2005/0077618 A1* | 4/2005 | McCutcheon et al. | ........ | 257/712 |
| 2005/0184377 A1 | 8/2005 | Takeuchi et al. | | |
| 2006/0038283 A1 | 2/2006 | Su et al. | | |
| 2006/0091528 A1* | 5/2006 | Yang | ................ | 257/706 |
| 2006/0097385 A1* | 5/2006 | Negley | ................ | 257/722 |
| 2006/0138644 A1* | 6/2006 | Houle et al. | ................ | 257/706 |
| 2006/0278974 A1 | 12/2006 | Hsiao et al. | | |
| 2007/0035008 A1 | 2/2007 | Wu et al. | | |
| 2007/0102809 A1* | 5/2007 | Dubin | ................ | 257/713 |
| 2007/0205792 A1 | 9/2007 | Mouli et al. | | |
| 2007/0215985 A1 | 9/2007 | Chen | | |
| 2007/0228554 A1 | 10/2007 | Yoshimi et al. | | |
| 2008/0093733 A1* | 4/2008 | Hsu | ................ | 257/722 |
| 2009/0129026 A1 | 5/2009 | Baek et al. | | |
| 2009/0283902 A1* | 11/2009 | Bezama et al. | ................ | 257/713 |
| 2010/0059880 A1* | 3/2010 | Baek | ................ | 257/713 |
| 2010/0148358 A1* | 6/2010 | Brunschwiler et al. | ........ | 257/714 |
| 2010/0230805 A1* | 9/2010 | Refai-Ahmed | ................ | 257/712 |
| 2010/0276701 A1* | 11/2010 | Hebert et al. | ................ | 257/77 |

OTHER PUBLICATIONS

International Search Report and Written Opinion—PCT/US2011/022585—ISA/EPO—Dec. 22, 2011.

* cited by examiner

*Primary Examiner* — A O Williams
(74) *Attorney, Agent, or Firm* — Michelle Gallardo; Nicholas J. Pauley; Jonathan T. Velasco

(57) ABSTRACT

An electrical package with improved thermal management. The electrical package includes a die having an exposed back surface. The package further includes a plurality of fins extending outwardly from the back surface for dissipating heat from the package. The die can be arranged in a multi-die stacking configuration. In another embodiment, a method of forming a die for improved thermal management of an electrical package is provided.

20 Claims, 7 Drawing Sheets

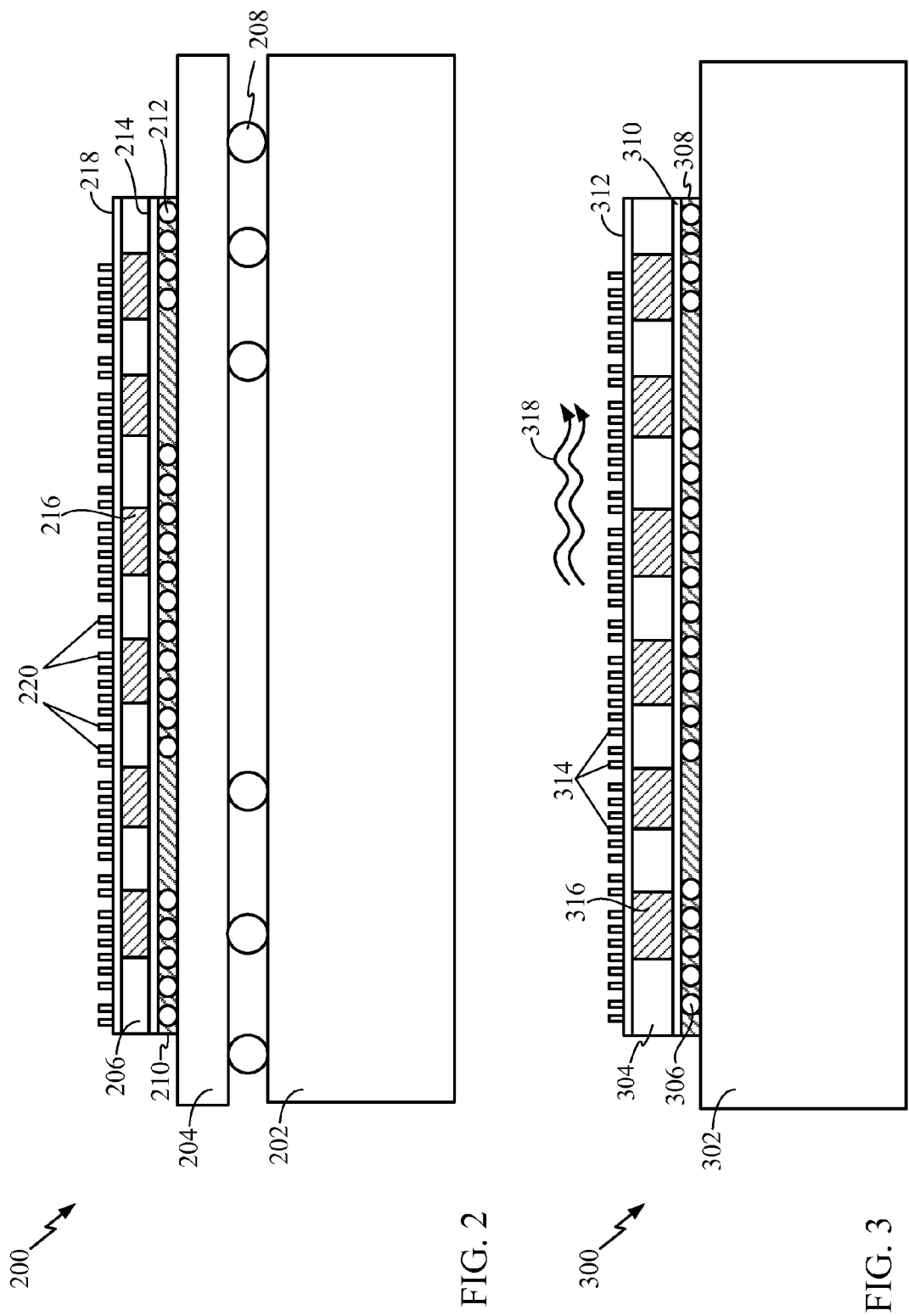

MICROFABRICATED PILLAR FINS FOR THERMAL MANAGEMENT

FIELD OF DISCLOSURE

This disclosure relates generally to electronic packaging, and in particular to a die having pillar fins for dissipating heat from an electrical package.

BACKGROUND

In electronic packaging, chips continue to be made smaller but are required to perform greater functionality. As chips perform more functions, however, greater power is consumed and more heat is generated. Also, as the size of the chip is reduced, the generated heat is required to dissipate from a smaller surface area. In a silicon chip, for example, it can be difficult to control the silicon surface and junction temperature.

In a conventional package, a heat sink is attached to a back surface of a die using thermal paste. In FIG. 1, for example, a conventional package 100 is shown. The package 100 includes a substrate 102 coupled to a system board 106 by a plurality of solder balls 108. The area between the substrate 102 and system board 106 also includes an underfill layer 110. A conventional die 104 is coupled to a back surface of the substrate 102 by a plurality of solder balls 116 or bumps. After the package 100 is assembled, a heat sink 112 is mounted to the back surface of the substrate 102 and the back surface of the die 104. Thermal paste 114 is used for securely mounting the heat sink 112 to the substrate 102 and die 104 and to improve thermal conductivity from the substrate 102 and die 104 to the heat sink 112. During operation, heat generated by the package 100 can be dissipated through the heat sink 112. However, the result of mounting the heat sink 112 to the package 100 can significantly increase the package size. In addition, attaching a heat sink to the conventional package 100 requires additional steps in the process of manufacturing and assembling the package. Therefore, it would be desirable to develop a compact, increased surface area solution for dissipating heat from a chip without reducing functionality or power consumption.

SUMMARY

For a more complete understanding of the present disclosure, reference is now made to the following detailed description and the accompanying drawings. In an exemplary embodiment, an electrical package is provided. The package includes a die having an outer surface and a fin integrally formed from the outer surface. The fin extends outwardly from the outer surface for dissipating heat from the package. The fin can be formed of a conductive material and have a cylindrical, square, or rectangular cross-section. The outer surface of the die can be exposed to the surrounding environment.

In this embodiment, the fin can have an aspect ratio of about 3:1. The fin can also comprise a plurality of fins. A channel can be defined between the plurality of fins and the plurality of fins can substantially occupy the outer surface of the die. The cross-section of each of the plurality of fins can be substantially similar to the shape of the outer surface.

In another embodiment, an electrical package is provided that includes a plurality of dies each of which has an outer surface. The package further includes a plurality of fins extending outwardly from the surface of at least one die. In this embodiment, the plurality of dies are coupled to one another and stacked within the package. The plurality of fins can be integrally formed from the back surface of the at least one die. In addition, the plurality of dies can comprise an upper die and a lower die such that the upper die is coupled to the lower die by a plurality of microbumps. In one aspect, the outer surface of the upper die comprises the plurality of fins and the outer surface of the lower die comprises the plurality of microbumps. In another aspect, a portion of the outer surface of the lower die comprises a plurality of fins extending outwardly therefrom.

The plurality of dies can also comprise at least one intermediate die. A back surface of the at least one intermediate die can comprise a plurality of microbumps for coupling to the upper die and a front surface of the at least one intermediate die can comprise a plurality of microbumps for coupling to the lower die. Alternatively, a portion of the back surface of the at least one intermediate die can comprise a plurality of fins extending outwardly therefrom.

In a different embodiment, a method of fabricating a die is provided. The method includes fabricating a die on a wafer and forming the cross-sectional shape of a pillar fin on a surface of the die. The pillar fin is formed integrally with the surface of the die and the wafer is diced to separate the die. The pillar fin can be formed using photolithography. Moreover, a microbump can be fabricated on the surface of the die. When the cross-sectional shape of the pillar fin is formed on the die, a photo resist is exposed on the surface of the die. Further, ultraviolet light can be passed through the mask such that the mask has a pattern and the cross-section of the pillar fin is formed by the pattern of light that passes through the mask.

The pillar fin can be formed by dipping the photo resist into an electrolytic bath. The current of the bath and the amount of time in which the photo resist is dipped into the bath can be controlled such that the height of the formed pillar fin is determined by the current and dipping time. The photo resist can be removed from the surface and a thermal contact can be formed on the surface. A passivation can be deposited on the surface by spin-coating or chemical vapor deposition. In addition, an opening can be formed in the passivation by a lithography process. A seed layer can also be deposited on the surface and then etched away from the surface by a plasma bombardment process.

BRIEF DESCRIPTION OF THE DRAWINGS

FIG. 2 is a schematic view of an exemplary embodiment of an electrical package having a die with pillar fins;

FIG. 3 is a schematic view of a different embodiment of an electrical package having a die with pillar fins;

DETAILED DESCRIPTION

Figure 1:
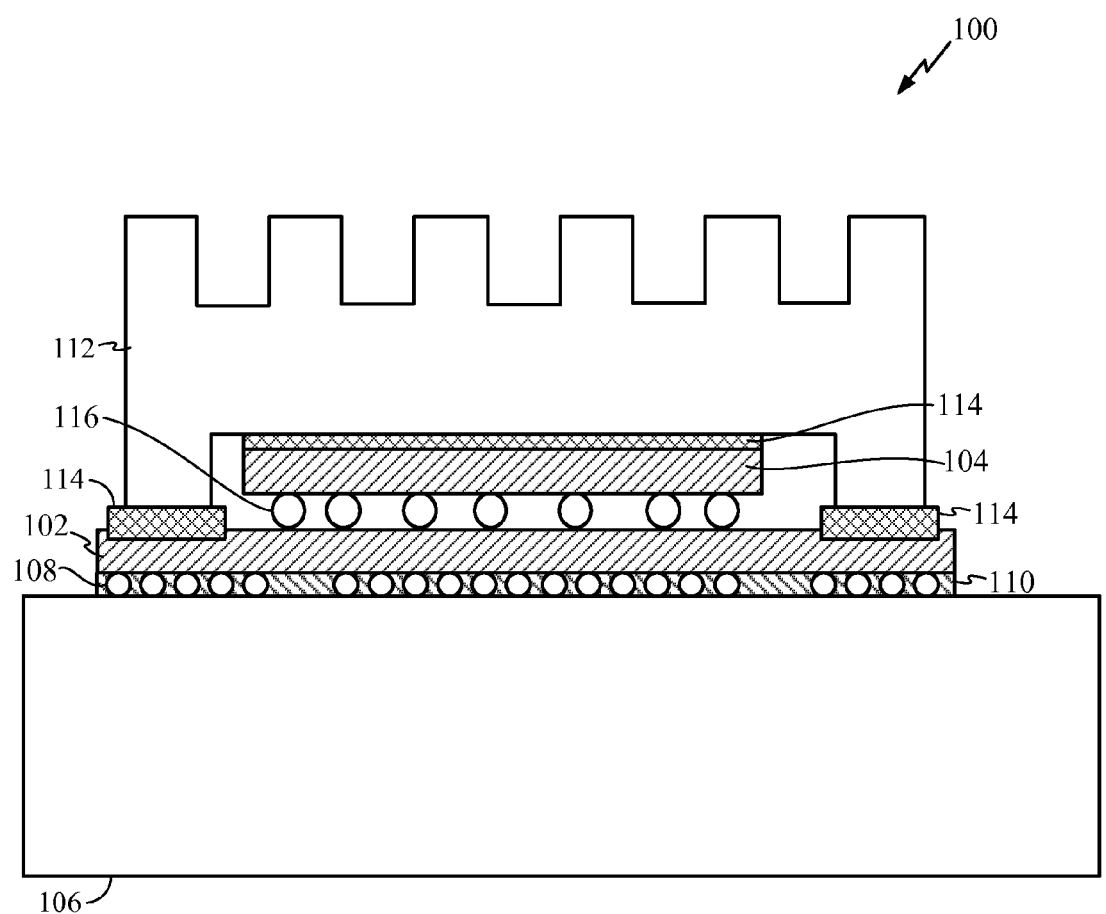
FIG. 1 is a schematic view of a conventional electrical package using thermal paste for mounting a heat sink to a die.

Referring to the exemplary embodiment shown in FIG. 2, an electronic package 200 with improved thermal management is provided. The package 200 includes a system board 202 and a substrate 204. The substrate 204, which can be formed of silicon or other substrate material, can be coupled to the system board 202 by solder balls 208, bumps, or any other coupling means. A die 206 can be electrically coupled to the substrate 204 by flip chip bumps 212, and an underfill layer 210 can be added therebetween to enhance the reliability of the package.

The die 206 can be made from silicon or any other material for making dies. The die 206 can include both Front-End-of-the-Line (FEOL) and Back-End-of-the-Line (BEOL) sections (shown simplified as a single layer 214). The FEOL section can include several top layers for active devices and the BEOL section can include a plurality of metal layers.

A plurality of pillar fins 220 extend outwardly from the back surface of the die 206 to improve the thermal management of the package 200. The location on the die where the pillar fins 220 can be formed is not limited to the back surface, but rather in other embodiments the plurality of pillar fins can be formed on different surfaces of the die (e.g., the front surface). In one embodiment, the plurality of pillar fins 220 can be integrally formed from the back surface of the die 206 by photolithography. The process of forming the plurality of pillar fins is described below with reference to FIG. 7. Each of the plurality of fins 220 is formed of a metal such as, for example, copper, nickel, tin, silver, or gold. The type of metal used to form the pillar fin 220 can depend upon desired properties, for example, oxidation resistance, thermal conductivity, cost, and lithography properties.

A pillar fin 220 can have different cross-sectional shapes including, for example, circular, square, or rectangular cross-sections. The shape of each pillar fin 220 can depend on the surface area of the die 206 at which the pillar fin 220 is formed. Another consideration given towards the type of cross-sectional shape each pillar fin 220 will be formed of is whether a forced convection system is used. The pillar fins 220 can form channels or passageways (see FIG. 4) along the back surface of the die 206 through which air can be forced to achieve a desired amount of heat transfer from the package.

Each pillar fin 220 can be formed to have an aspect ratio, i.e., ratio of height-to-diameter, of about 3:1. The diameter and height for each pillar fin 220 can be, for example, between 10-30 µm and 10-70 µm, respectively. In other embodiments, however, the diameter and height can be smaller or larger to achieve desired thermal management. When formed on the back surface of the die 206, the plurality of pillar fins 220 can be spaced as desired for the particular application. For example, the pillar fins 220 can be spaced between 30-100 µm apart from one another. By forming the pillar fins 220 in close proximity to one another on the back surface of the die 206, the package 200 can dissipate more heat from a smaller area. As a result, chips can be made smaller and the overall size of the package can be reduced.

A front surface of the die 206 can also be electrically coupled to a back surface of the same die 206 by a plurality of metal-filled vias 216. The plurality of vias 216, which can be through-silicon vias, for example, can be formed by a via last process or any other process for forming vias. The plurality of vias can be filled with copper or other conductive material. The plurality of vias 216 increase the thermal conductivity from the front surface of the die 206 to the pillar fins 220 on the back surface of the die 206. This can enable more heat dissipation from the front surface of the die 206 and substrate 204.

In addition, a metal layer 218, which is also referred to as a seed layer, can be fabricated at the back surface of the die 206. The metal layer 218 can be formed of a conductive material such as, for example, copper or titanium. The metal layer 218 can provide increased thermal conductivity between the various pillar fins 220 and enable heat to be better distributed for dissipation through the pillar fins 220.

Also, as shown in FIG. 2, the back surface of the die 206 is exposed to the surrounding environment. This is different from conventional packages such as the one shown in FIG. 1 in which the back surface of the die 104 is coated with thermal paste for attaching the heat sink 112 to the die 104. The heat sink 112 and the thermal paste 114 prevent the back surface of the die 104 from being exposed to the surrounding environment. Thus, the package 200 may have a smaller height and size than the conventional package 100. In addition, the conventional package 100 may have increased thermal resistance between the surrounding environment and the die 104 due to the thermal paste 114 and heat sink 112. In contrast, the pillar fins 220 have very little, if any, thermal resistance between the surrounding environment and the die 206.

In FIG. 3, a different embodiment of an electronic package 300 with improved thermal management is shown. The package 300 includes a system board 302 to which a die 304 directly couples. Flip chip bumps 306 and the like can be used for coupling the die 304 to the system board 302. An underfill layer 308 can be added therebetween to provide reliability to the package.

Near a front surface of the die 304, FEOL and BEOL sections can be provided as described above. In FIG. 3, the FEOL and BEOL sections are shown as layer 310. One or more metal layers 312 can be formed on a back surface of the die 304 and a plurality of metal-filled vias 316 can couple the front surface of the die 304 to the back surface. The one or more metal layers 312 can be formed of conductive material such as, for example, copper or titanium and the plurality of vias can be filled with copper or any other conductive material. The plurality of vias 316 can advantageously be formed in the die 304 for additional thermal conductivity.

Also formed at the back surface of the die 304 is a plurality of pillar fins 314. The plurality of pillar fins 314 can be made of a conductive material such as, for example, copper, nickel, tin, silver, gold, or any other conductive material. Heat produced within the package can be conducted through the plurality of vias 316 and pillar fins 314 and transferred out of the package through convection or forced convection. In a forced convection system, for example, air flow along a direction indicated by arrow 318 can be used for cooling the package 300. Also, similar to the die 206 of FIG. 2, the back surface of the die 304 is exposed to the surrounding environment.

Figure 4:
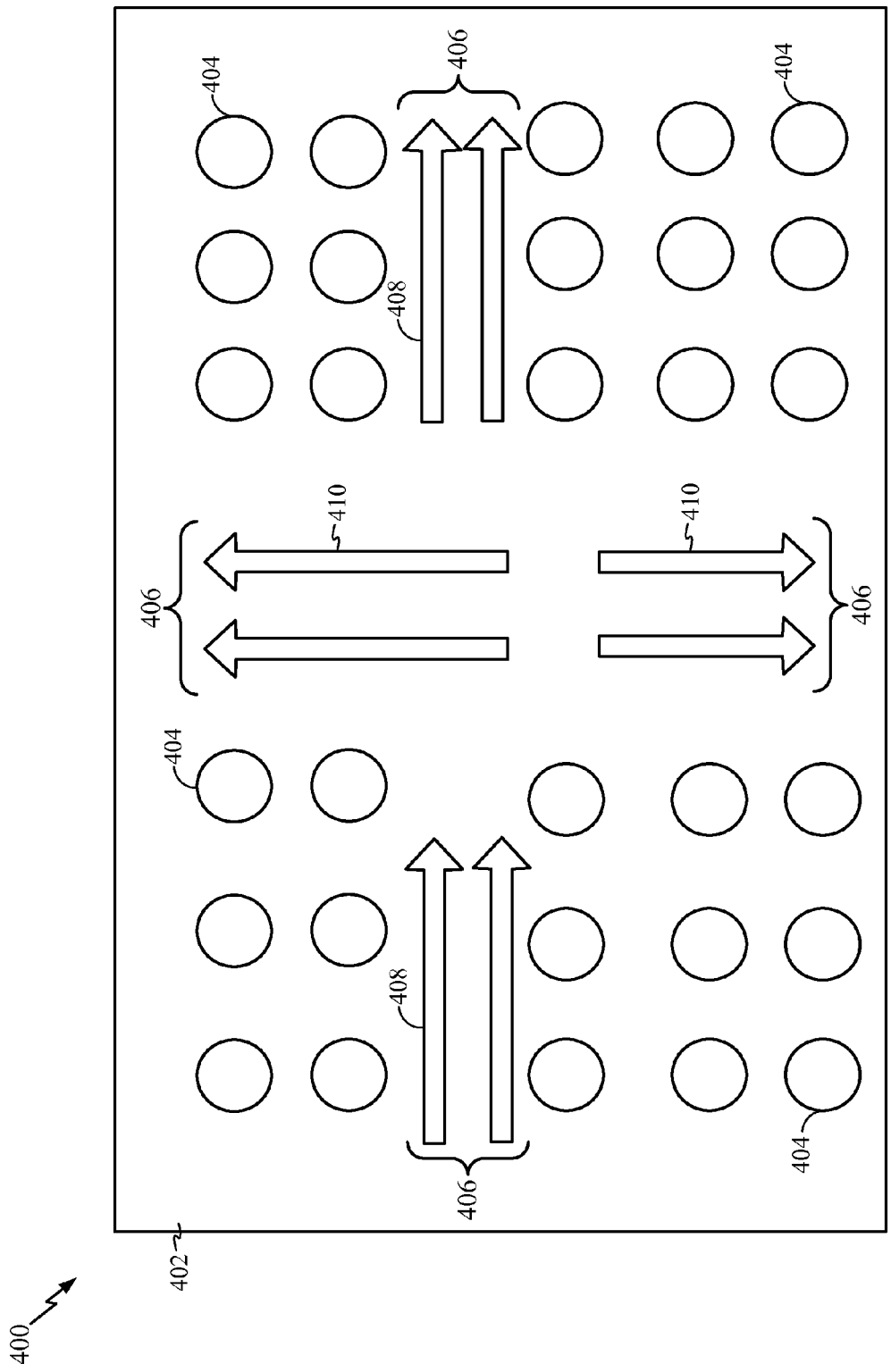
FIG. 4 is a schematic of a top view of a die having a plurality of pillar fins extending outwardly therefrom.

With reference to FIG. 4, a back surface 402 of a die 400 is provided. A plurality of pillar fins 404 are formed on the back surface 402 of the die 400 and extend outwardly therefrom. As noted above, any surface of the die can be used for forming pillar fins, but in the embodiment of FIG. 4 only the back surface 402 of the die 400 is shown having pillar fins 404. Each pillar fin 404 has a circular shaped cross-section, but in other embodiments can have a differently shaped cross-section. The plurality of pillar fins 404 are arranged on the back surface 402 such that channels or passageways 406 are defined therebetween. In the embodiment of FIG. 4, for example, air can flow in a forced convection system in a longitudinal direction indicated by arrow 408 and/or transverse direction indicated by arrow 410. Not only can the air flow through the channels 406, but air can also flow between each pillar fin 404 as the fins are spaced between 30-100 µm to allow air flow. In other embodiments, the plurality of pillar fins 404 can be arranged to define additional or fewer channels.

Figure 5:
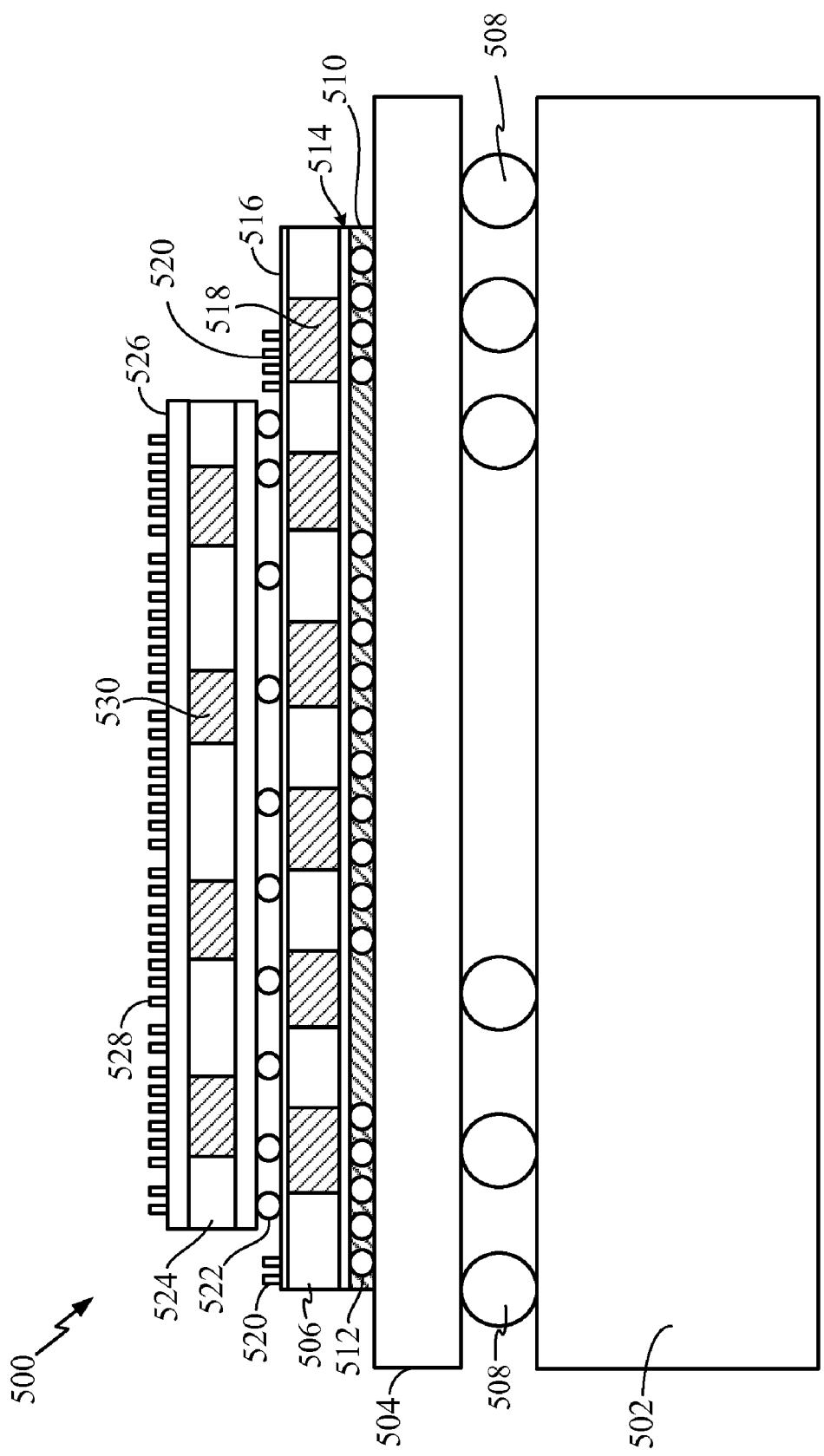
FIG. 5 is a schematic view of an embodiment of multi-die stacking with pillar fins.

In the embodiment of FIG. 5, an electronic package 500 is provided with more than one die. The package 500 includes a system board 502, a substrate 504, a first die 506 and a second die 524. The first die 506 can be referred to as a lower die and the second die 524 can be referred to as an upper die. The substrate 504, which can be made from silicon or any other substrate material, can be coupled to the system board 502 by a plurality of solder balls 508 or bumps. Likewise, the first die 506 can be coupled to the substrate 504 by a plurality of flip chip bumps 512. An underfill layer 510 can also be added between the first die 506 and substrate 504.

Near a front surface of the first die 506, FEOL and BEOL sections can be provided and are indicated by layer 514 in FIG. 5. One or more metal layers 516 can be disposed at the back surface of the first die 506. The one or more metal layers 516 can be formed of any thermally conductive material such as copper.

The second die 524 can be coupled to the first die 506 by a plurality of microbumps 522. Other means for coupling the two dies can be used in different embodiments. The first die 506 and second die 524 can be made of silicon or other material. One or more metal layers 526 can be formed at a back surface of the second die 524. The one or more metal layers 526 can be made of conductive material such as copper. A plurality of metal-filled vias 518 can be formed in the first die 506 for thermally conducting heat through the package from the front surface to the back surface of the first die 506. Likewise, a plurality of vias 530 can also be formed in the second die 524 for conducting heat from the front surface to the back surface of the second die 524. The plurality of vias 518, 530 can be filled with copper or any other thermally conductive material.

A plurality of pillar fins 528 can be integrally formed from the back surface of the second die 524 and extend outwardly therefrom. The plurality of pillar fins 528 can be any cross-sectional shape including circular, square, or rectangular. In addition, the plurality of fins 528 can be formed from copper, nickel, tin, silver, gold, or any other conductive material. The plurality of pillar fins 528 can be arranged on the back surface of the second die 524 to improve the thermal management of the package 500. In addition, a plurality of pillar fins 520 can also be formed from the back surface of the first die 506. Although the back surface of the first die 506 also includes the plurality of microbumps 522 for coupling the first and second dies, the plurality of pillar fins 520 can be formed at different areas or portions along the back surface of the first die 506. In this embodiment, additional heat can be transferred from the package 500 through the plurality of vias 518, metal layer 516 and pillar fins 520 of the first die 516 and through the plurality of vias 530, metal layer 526 and pillar fins 528 of the second die 524.

In addition, at the location of which the pillar fins 520 are formed from the back surface of the first die 506, the back surface is exposed to the surrounding environment. Likewise, the back surface of the second die 524 is also exposed to the surrounding environment. Hence, the package 500 is smaller and better able to dissipate heat from smaller surface areas of the dies.

Figure 6:
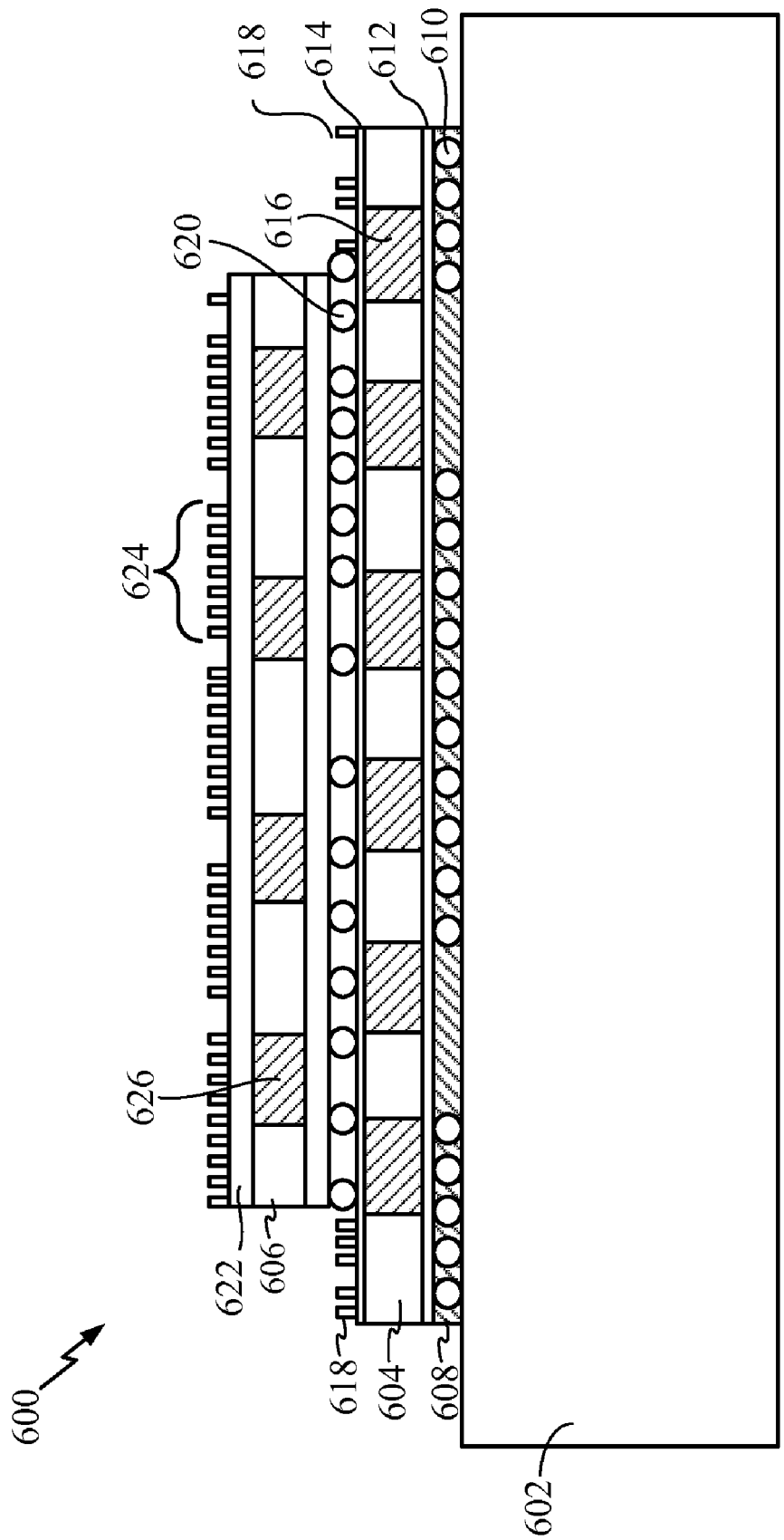
FIG. 6 is a schematic view of another embodiment of multi-die stacking with pillar fins.

With reference to FIG. 6, another electronic package 600 is shown with multi-die stacking. The package 600 includes a system board 602 and a first die 604 coupled directly thereto. The first die 604 can be coupled to the system board 602 by a plurality of flip chip bumps 610. An underfill layer 608 can also be added between the first die 604 and the system board 602. A second or upper die 606 is also provided in the package 600, and is coupled to the first or lower die 604 by a plurality of microbumps 620.

Near a front surface of the first die 604, FEOL and BEOL sections can be provided and are indicated by layer 612 in FIG. 6. One or more metal layers 614 can be disposed at the back surface of the first die 604. The one or more metal layers 614 can be formed of a conductive material such as copper.

The second die 606 can be coupled to the first die 604 by a plurality of microbumps 620. Other means for coupling the two dies can be used in different embodiments. The first die 604 and the second die 606 can be made of silicon, for example, or any other material used for making dies. One or more metal layers 622 can be formed at a back surface of the second die 606, and these layers 622 can be made of a conductive material such as copper. A plurality of metal-filled vias 616 can be formed in the first die 604 for thermally conducting heat through the package. Likewise, a plurality of vias 626 can also be formed in the second die 606 for performing the same function. Therefore, heat produced by a transistor, for example, in the FEOL section can be thermally conducted through the plurality of vias 616 in the first die 604, the plurality of microbumps 620 between the first and second dies, and the plurality of vias 626 in the second die 606. The plurality of vias 616, 626 can be filled with copper or any other conductive material.

A plurality of pillar fins 624 can be integrally formed from the back surface of the second die 606 and extend outwardly therefrom. Again, the back surface of the second die 606 is exposed to the surrounding environment. The plurality of pillar fins 624 can have any cross-section including circular, square, or rectangular. In addition, the plurality of fins 624 can be formed from copper, nickel, tin, silver, gold, or any other conductive material. The plurality of pillar fins 624 can be arranged on the back surface of the second die 606 to improve the thermal management of the package 600. Therefore, as heat is conductively transferred through the plurality of vias 626 in the second die 606, the heat can be released from the package 600 through the plurality of pillar fins 624.

In addition, a plurality of pillar fins 618 can also be formed from the back surface of the first die 604. Although the back surface of the first die 604 also includes the plurality of microbumps 620 for coupling the first and second dies, the plurality of pillar fins 618 can be formed at different areas or portions along the back surface of the first die 604 which are exposed to the surrounding environment (e.g., not covered by the second die 606). In this embodiment, heat that is conducted through the plurality of vias 616 in the first die 604 can be transferred to the surrounding environment through the plurality of pillar fins 618.

Although only an upper and lower die are shown in the embodiments of FIGS. 5 and 6, one or more dies can be stacked therebetween. A third die, for example, could be stacked between the first die 604 and second die 606 and include vias and pillar fins. Microbumps, for example, could be used for coupling the third die to the first and second dies in this embodiment.

Figure 7:
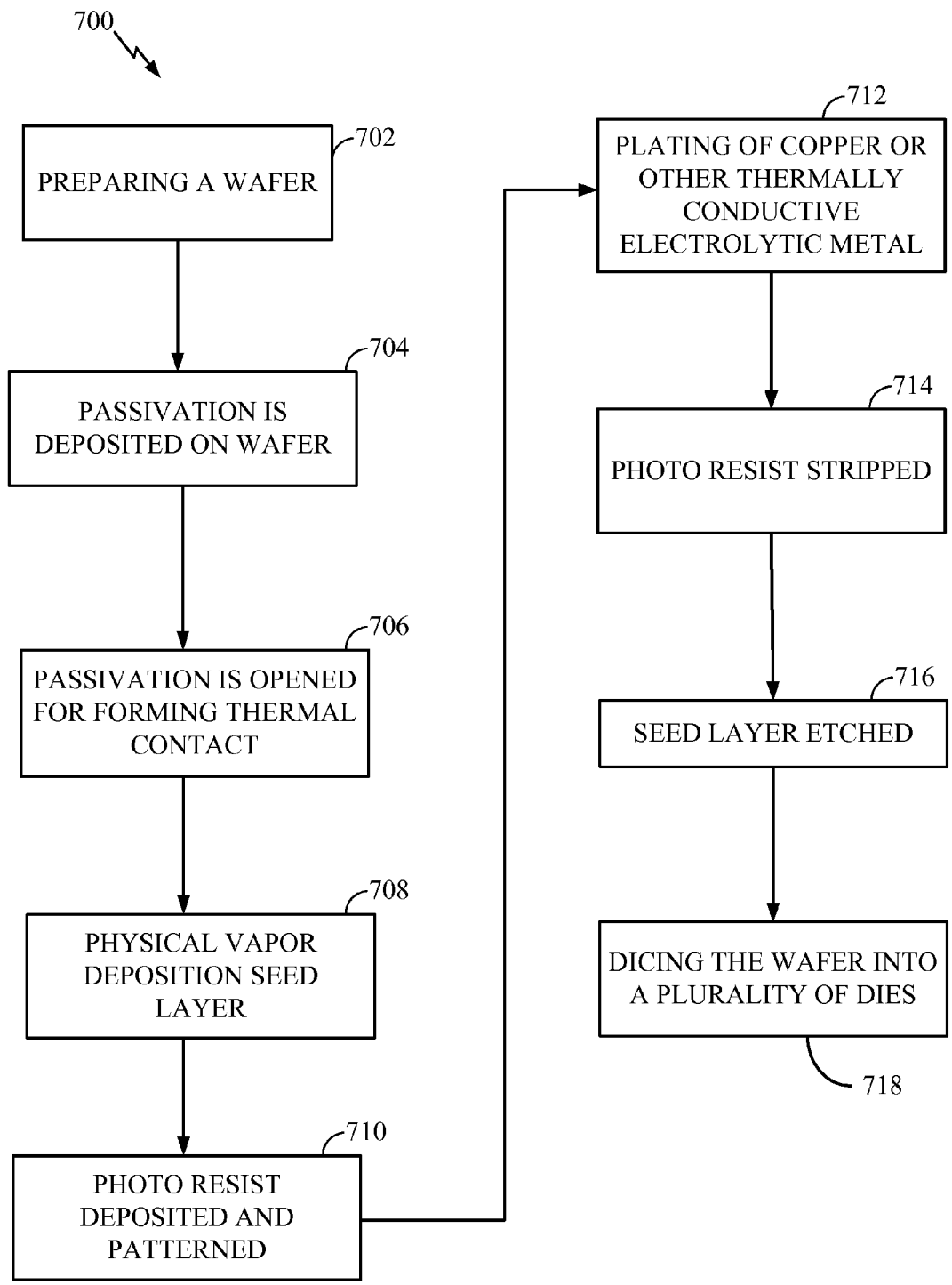
FIG. 7 is a flow diagram for a process of forming a die with pillar fins.

With reference to FIG. 7, a method 700 of forming a die for improved thermal management of an electrical package is provided. The method 700 includes preparing a wafer from which a plurality of dies will be formed. In block 702, for example, preparing the wafer includes front-end processing and back-end processing. During front-end processing, which is known, transistors and other devices are formed on the wafer. Back-end processing, which is also known, includes creating metal interconnecting wires to form electrical circuits and isolating the wires with dielectric materials. The wafer is mounted on a carrier such as plastic tape, for example.

Thermal contacts are formed on the wafer at locations where pillar fins will be formed. To do so, in block 704, a passivation is deposited on the front or back surface of the wafer where the pillar fins will be fabricated. The passivation can serve as a protective layer for the die. For example, the passivation protects the die from debris during manufacturing processes such as bonding. The material can be spin coated or chemical vapor deposited (CVD) on the die. With reference to block 706, once the passivation is deposited, openings are formed in the passivation so that a thermal contact can be fabricated between the underlying wafer and soon-to-be-formed pillar fin. In other words, the passivation is thermally and electrically insulative such that when openings are formed therein, a thermal path is provided between the die and the fins (once formed). If the passivation is photosensitive, the opening in the passivation is formed using photolithography. In this case, a mask is placed on the surface of the wafer on which the pillar fins are being fabricated and an ultraviolet or intense light is directed onto the mask. The masked wafer is then placed into a chemical solution, e.g., developer, to wash away or remove the areas exposed to the light. If the passivation is not photosensitive, however, a photo sensitive resist material is spin coated or laminated and a similar lithography process is performed.

In block 708, a thin layer of "seed" metal is deposited on the wafer by a physical vapor deposition (PVD) process. In this process, a target consisting of the "seed" metal is bombarded by a high energy source such as a beam of electrons or ions, for example. As such, atoms from the surface of the target are dislodged or vaporized and deposited onto the wafer surface. The seed layer, which is shown, for example, in FIG. 2 as the metal layer 218 fabricated on the back surface of the die 206, functions as a conductive layer during a plating process and can have a thickness of less than a micron. The seed metal can be, for example, copper or titanium. Other metals can also be used for forming the seed layer.

With reference to block 710, a photo resist is deposited on the wafer by spin coating or a CVD process. The wafer is then exposed to a pattern of ultraviolet or intense light, for example. During this process, the cross-section or pattern of the pillar fin being formed is established. As such, if an area on the wafer is exposed to a circular pattern of intense light through a mask, the pillar fin being formed in that area will have a circular cross-section. The mask can vary the pattern of ultraviolet or intense light being exposed to the area on the wafer such that pillar fins can have any shaped cross-section. This is especially important if the available area for heat transfer on the die has a specific shape such that the quantity of pillar fins formed in this area can be maximized to achieve desired heat transfer from the die. For example, if the available area on the die is substantially annular, the masked pattern of ultraviolet or intense light can be substantially annular to form a plurality of pillar fins having a specific cross-section for occupying the substantially annular area on the die.

In block 712, the photo resist is dipped into an electrolytic bath with both current and time being controlled. Copper or any other thermally conductive electrolytic metal can be deposited electrolytically in those areas which have an exposed seed layer. As such, a plurality of pillar fins are integrally formed with the wafer. The height and diameter of the plurality of pillar fins can be varied by changing the amount of time the photo resist is dipped into the electrolytic bath. It is also important that the photo resist that is deposited in block 710 includes a sufficient thickness to support a desired height. As described above, for example, pillar fins can have an aspect ratio of about 3:1. Alternatively, to increase the surface area of the pillar fins, each pillar fin can have an aspect ratio of about 10:1

In block 714, the photo resist can be stripped. One way to strip the photo resist is by using plasma bombardment in a dry process. Alternatively, in a wet process, the remaining resist can be dissolved by chemically altering the resist such that it no longer adheres to the wafer. In other embodiments, the resist can be peeled off the wafer. In an embodiment in which the photo resist is taller (e.g., thicker), the plasma bombardment or peeling methods are preferred.

In block 716, the "seed" layer is etched away. In this block, a small amount of material is removed through plasma bombardment.

In the case of at least a portion of a die being formed without pillar fins (e.g., as an intermediate die in a package of multi-die stacking), a plurality of microbumps can be formed on the front or back surface of the wafer. Alternatively, a plurality of microbumps and pillar fins can be formed on the front or back surface of the wafer for a single die. In this case, for example, the die that includes both pillar fins and microbumps can be incorporated into a package similar to the first die in FIGS. 5 and 6.

Once the plurality of pillar fins are formed on the front or back surface of the wafer, in block 718, the wafer is cut or diced into a plurality of die. A single die can be integrated into an electrical package, for example, by attaching the die to a substrate. A second die can be mounted onto a first die and additional dies can be stacked to form a multi-die package. Once integrated into a package, package back-end assembly can be completed to form the electrical package.

As described above with respect to block 712, the pillar fins are integrally formed with the wafer. As such, the manufacturing and assembly processes for preparing an electrical package with a die having a plurality of pillar fins advantageously requires less steps compared to conventional packages having heat sinks. For example, once the die having the plurality of pillar fins is diced and separated from the wafer, the die is ready to be integrated in the package. On the other hand, with conventional packages such as the one shown in FIG. 1, the heat sink 112 is physically or mechanically attached to the die 104 after the die 104 is separated from the wafer. For a heat sink to be attached to the wafer before the dicing process, the heat sink would have to be too small to be an effective heat sink. A larger heat sink cannot be attached to the wafer before dicing because the larger heat sink occupies too much space on the wafer for the dicing process to be performed. In the likely event more than one die is diced and separated from the wafer, multiple assembly steps are required to attach a heat sink to each die (e.g., apply thermal paste to the die, mount the heat sink to the die, etc.). Therefore, the conventional die 104 is not ready to be integrated into the conventional package 100 after being diced and separated from the wafer.

The method of forming pillar fins for thermal management has several other advantages over conventional processes of manufacturing heat sinks for thermal management. For example, conventional heat sink formation processes greatly increase and/or require large surface areas on the die for the heat sink to be attached thereto. In contrast, a plurality of pillar fins can be formed in a relatively small area on the die (i.e., requires less space on the die). In addition, the process of forming pillar fins is such that differently shaped cross-sectional pillar fins can easily be formed to achieve desirable thermal management by altering the patterns of the photo resist mask. On the other hand, conventional processes cannot easily fabricate different shapes or sizes of heat sinks.

Also, while the process of forming pillar fins can be similar to the process of forming microbumps, there are some important differences. First, when microbumps are formed, the process includes "capping" or "plating" the microbumps with solder, nickel, gold, etc. so that the microbumps can be used for joining to other materials. In other words, the metal used to "cap" or "plate" the microbump is essential for joining or coupling the microbump to another material such as a die. In contrast, the pillar fin does not need to be "capped" or "plated" with an outer metal layer. Instead, the pillar fin is not joined or coupled to another material, but rather used for heat transfer. The outer metal of the pillar fin is therefore a highly conductive metal such as copper. In addition, microbumps and/or bumps are only formed with a cylindrical cross-section, whereas the pillar fin can be fabricated with a cylindrical and non-cylindrical cross-section to achieve a desired thermal characteristic.

Figure 8:
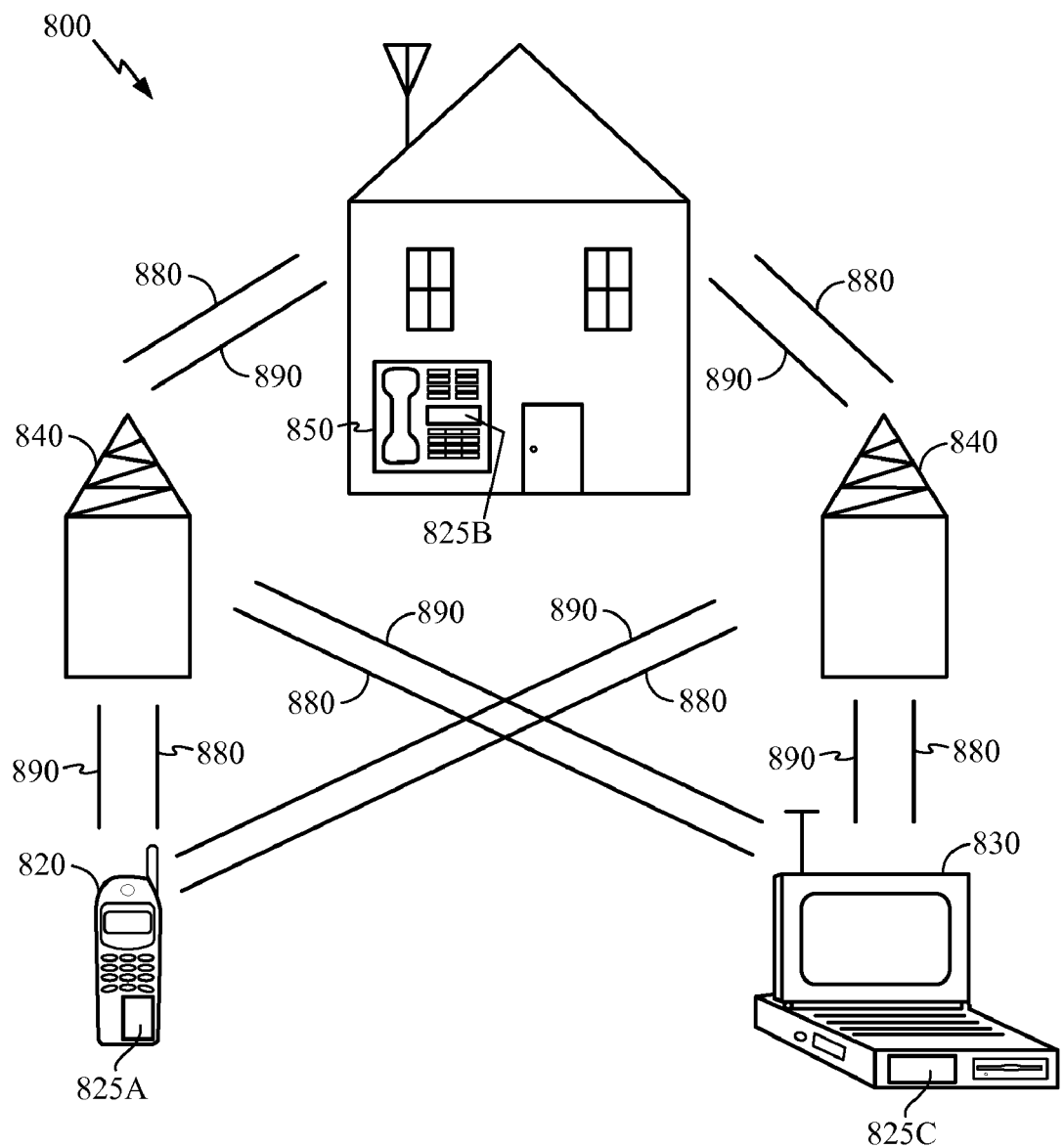
FIG. 8 is a block diagram showing an exemplary wireless communication system in which it may be advantageous to use a package having pillar fins for thermal management.

FIG. 8 shows an exemplary wireless communication system 800 in which an embodiment of an electronic package with a die having pillar fins extending outwardly from its back surface may be advantageously employed. For purposes of illustration, FIG. 8 shows three remote units 820, 830, and 850 and two base stations 840. It should be recognized that typical wireless communication systems may have many more remote units and base stations. Any of remote units 820, 830, and 850, as well as the base stations 840, may include an electronic package with a die having pillar fins extending outwardly from its back surface such as disclosed herein. FIG. 8 shows forward link signals 880 from the base stations 840 and the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 8 illustrates certain exemplary remote units that may include an electronic package with a die having pillar fins extending outwardly from its back surface as disclosed herein, the package is not limited to these exemplary illustrated units. Embodiments may be suitably employed in any electronic device in which an electronic package with a die having pillar fins extending outwardly from its back surface is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An electrical package, comprising:
   a die having an outer surface;
   a metallic seed layer disposed on the outer surface; and
   a fin integrally formed from the metallic seed layer and extending outwardly therefrom for dissipating heat from the package.

2. The electrical package of claim 1, wherein the fin is formed of a conductive material.

3. The electrical package of claim 1, wherein the fin has a cylindrical, square, or rectangular cross-section.

4. The electrical package of claim 1, wherein the fin comprises a plurality of fins.

5. The electrical package of claim 4, further comprising a channel defined. between the plurality of fins.

6. The electrical package of claim 4, wherein the plurality of fins substantially occupy the outer surface of the die.

7. The electrical package of claim 4, wherein the cross section of each of the plurality of fins is substantially similar to the shape of the outer surface.

8. The electrical package of claim 1, wherein the fin has an aspect ratio between about 3:1 to about 10:1.

9. The electrical package of claim 1, further comprising a via formed in the die.

10. The electrical package of claim 1, wherein the metallic seed layer is exposed to the surrounding environment.

11. An electrical package, comprising:
    a plurality of dies each of which has an outer surface;
    a metallic seed layer disposed on the outer surface of each of the plurality of dies; and
    a plurality of fins extending outwardly from the metallic seed layer of at least one die;
    wherein, the plurality of dies are coupled to one another and stacked within the package.

12. The electrical package of claim 11, wherein the plurality of fins is integrally formed from the metallic seed layer disposed on the at least one die.

13. The electrical package of claim 11, wherein the plurality of dies comprises an upper die and a lower die, the upper die coupled to the lower die by a plurality of microbumps.

14. The electrical package of claim 13, wherein the plurality of fins extends outwardly from the surface of the upper die and from a portion of the surface of the lower die.

15. The electrical package of claim 13, wherein a back surface of the lower die comprises a plurality of microbumps for coupling to the upper die and a front surface of the lower die comprises a plurality of microbumps for coupling to an electronic device.

16. The electrical package of claim 15, wherein a portion of the back surface of the lower die comprises a plurality of fins extending outwardly therefrom.

17. An electrical package, comprising:
    a die having an outer surface;
    a metallic seed layer disposed on the outer surface; and
    means for dissipating heat from the die;
    wherein, the means for dissipating is integrally formed from the metallic seed layer.

18. The electrical package of claim 17, wherein the means for dissipating extends outwardly from the metallic seed layer.

19. The electrical package of claim 17, wherein:
    the die comprises a plurality of dies each of which has an outer surface;
    the metallic seed layer is disposed on the outer surface of the plurality of dies; and
    the means for dissipating is integrally formed from the metallic seed layer on at least one of the plurality of dies.

20. The electrical package of claim 17 incorporated into a device selected from a group consisting of a music player, a video player, an entertainment unit, a navigation device, a communications device, a personal digital assistant (PDA), a fixed location data unit, and a computer.

* * * * *